United States Patent
Yamazaki (10) Patent No.: US 12,250,775 B2
(45) Date of Patent: Mar. 11, 2025

(54) ROTARY MOUNTING HEAD AND COMPONENT MOUNTING MACHINE

(71) Applicant: YAMAHA HATSUDOKI KABUSHIKI KAISHA, Iwata (JP)

(72) Inventor: Shingo Yamazaki, Iwata (JP)

(73) Assignee: YAMAHA HATSUDOKI KABUSHIKI KAISHA, Iwata (JP)

(*) Notice: Subject to any disclaimer, the term of this patent is extended or adjusted under 35 U.S.C. 154(b) by 425 days.

(21) Appl. No.: 17/637,438

(22) PCT Filed: Oct. 3, 2019

(86) PCT No.: PCT/JP2019/039043
§ 371 (c)(1),
(2) Date: Feb. 22, 2022

(87) PCT Pub. No.: WO2021/064929
PCT Pub. Date: Apr. 8, 2021

(65) Prior Publication Data
US 2022/0279691 A1 Sep. 1, 2022

(51) Int. Cl.
*H05K 13/04* (2006.01)

(52) U.S. Cl.
CPC ....... *H05K 13/0409* (2018.08); *H05K 13/041* (2018.08); *H05K 13/0413* (2013.01)

(58) Field of Classification Search
CPC ............ H05K 13/0409; H05K 13/041; H05K 13/0413
See application file for complete search history.

(56) References Cited

U.S. PATENT DOCUMENTS

| | | | | |
|---|---|---|---|---|
| 5,117,761 A | * | 6/1992 | Kasai | H05K 13/085 108/22 |
| 5,313,401 A | * | 5/1994 | Kasai | H05K 13/041 29/829 |

(Continued)

FOREIGN PATENT DOCUMENTS

| | | |
|---|---|---|
| CN | 102638964 A | 8/2012 |
| CN | 104105905 A | 10/2014 |

(Continued)

OTHER PUBLICATIONS

An Office Action mailed by China National Intellectual Property Administration on Mar. 27, 2024, which corresponds to Chinese U.S. Appl. No. 17/637,438.8 and is related to U.S. Appl. No. 17/637,438; with English language translation.

(Continued)

*Primary Examiner* — Jeffrey T Carley
*Assistant Examiner* — Jose K Abraham
(74) *Attorney, Agent, or Firm* — Studebaker Brackett PLLC (57) ABSTRACT

A plurality of driven gears respectively provided on the plurality of nozzle shafts are arranged along the peripheral edges of the drive gears and engaged with the drive gears. Accordingly, the plurality of shafts can be turned by turning the drive gears. Moreover, since the turning of the drive gears, which are scissors gears, is transmitted to the nozzle shafts by the engagement of the drive gears and the plurality of respective driven gears, backlash between the drive gears and the driven gears is suppressed, it is not necessary to provide a backlashless gear (scissors gear) on each of the plurality of nozzle shafts, and the cost of the mounting head is suppressed.

4 Claims, 10 Drawing Sheets

(56) References Cited

U.S. PATENT DOCUMENTS

| | | | | |
|---|---|---|---|---|
| 5,417,542 A * | 5/1995 | Suzuki | ............... | H05K 13/041 |
| | | | | 414/737 |
| 2001/0008326 A1 * | 7/2001 | Isogai | ............... | H05K 13/0408 |
| | | | | 269/329 |
| 2002/0011000 A1 * | 1/2002 | Yoshida | ............ | H05K 13/0413 |
| | | | | 29/832 |
| 2003/0209679 A1 * | 11/2003 | Kodama | ........... | H05K 13/0069 |
| | | | | 250/559.29 |
| 2013/0255057 A1 * | 10/2013 | Komatsu | ............ | H05K 13/041 |
| | | | | 269/57 |

FOREIGN PATENT DOCUMENTS

| | | | | | |
|---|---|---|---|---|---|
| CN | 204934809 U | * | 1/2016 | | |
| JP | 2002130388 A | * | 5/2002 | | |
| JP | 2004-225732 A | | 8/2004 | | |
| JP | 2012178393 A | * | 9/2012 | | |
| JP | 2013026469 A | * | 2/2013 | ............ | H05K 13/04 |
| JP | 2013-135151 A | | 7/2013 | | |
| JP | 5690605 B2 | * | 3/2015 | | |
| JP | 2017-098541 A | | 6/2017 | | |
| WO | 2017/009932 A1 | | 1/2017 | | |
| WO | WO 2018131969 A2 | * | 7/2018 | | |
| WO | 2018/185941 A1 | | 10/2018 | | |

OTHER PUBLICATIONS

International Search Report issued in PCT/JP2019/039043; mailed Dec. 17, 2019.

* cited by examiner

ROTARY MOUNTING HEAD AND COMPONENT MOUNTING MACHINE

CROSS-REFERENCE TO RELATED APPLICATION

This application is a National Stage of International Patent Application No. PCT/JP2019/039043, filed Oct. 3, 2019, the entire contents of which is incorporated herein by reference.

BACKGROUND

Technical Field

This disclosure relates to a technique for mounting a component on a substrate using a rotary mounting head for sucking the components by nozzles respectively attached to a plurality of circumferentially arrayed shafts.

Background Art

Conventionally, a rotary mounting head is known which sucks a component by nozzles respectively attached to the lower ends of a plurality of circumferentially arrayed shafts. A mechanism for turning each shaft about a center axis of the shaft is provided in such a rotary mounting head. For example, in JP 2013-135151 A, a drive gear arranged inside the plurality of shafts is engaged with driven gears provided on the respective shafts, and the respective shafts turn as the drive gear turns. Particularly in JP 2013-135151 A, a backlashless gear is mounted as the driven gear on each of the plurality of shafts to suppress the influence of the backlash of the gear on the turning position of the shaft.

SUMMARY

However, as many backlashless gears as the shafts need to be mounted in the configuration in which the backlashless gear is provided on each of the plurality of shafts provided in the rotary mounting head. Thus, there has been a problem of increasing the cost of the rotary mounting head.

This disclosure was developed in view of the above problem and aims to provide a technique enabling a low-cost configuration of a rotary mounting head for turning a plurality of shafts by driving a driven gear on each of the plurality of shafts while suppressing the backlash of the gears.

The rotary mounting head according to the disclosure includes a scissors gear; and a plurality of shafts each including a driven gear to be engaged with the scissors gear and arrayed along a peripheral edge of the scissors gear.

In the disclosure (rotary mounting head) thus configured, the plurality of driven gears respectively provided on the plurality of shafts are arranged along the peripheral edge of the scissors gear and meshed with the scissors gear. Accordingly, the plurality of shafts can be turned by turning the scissors gear. Moreover, since the turning of the scissors gear is transmitted to the shafts by the engagement of the scissors gear and each of the plurality of driven gears, the backlash of the gears is suppressed, it is not necessary to provide a backlashless gear on each of the plurality of shafts, and the cost of the rotary mounting head is suppressed. By driving the driven gear on each of the plurality of shafts in this way, the rotary mounting head for turning the plurality of shafts can be configured at low cost while the backlash of the gears is suppressed.

The rotary mounting head may be further included a pressing mechanism configured to press the driven gear on each of the plurality of shafts against the scissors gear. By pressing the plurality of driven gears respectively provided on the plurality of shafts against the scissors gear in this way, each of the plurality of driven gears and the scissors gear can be firmly engaged. As a result, the plurality of shafts can be turned while the backlash of the gears is reliably suppressed.

The rotary mounting head may be configured so that the pressing mechanism is configured to press the driven gear on each of the plurality of shafts against the scissors gear by attracting the shafts toward the scissors gear by a magnetic force. In such a configuration, each of the plurality of driven gears and the scissors gear can be firmly engaged by the magnetic force. As a result, the plurality of shafts can be turned while the backlash of the gears is reliably suppressed.

The rotary mounting head may be configured so that the pressing mechanism includes a magnet mounted on the scissors gear and is configured to attract the shafts and the scissors gear to each other by a magnetic force generated by the magnet. In such a configuration, by attracting each of the plurality of shafts and the scissors gear to each other by the magnetic force generated by the magnet mounted on the scissors gear, each of the plurality of driven gears and the scissors gear can be firmly engaged. As a result, the plurality of shafts can be turned while the backlash of the gears is reliably suppressed.

The rotary mounting head may be configured so that the pressing mechanism includes an endless elastic member for surrounding the plurality of shafts, the elastic member is configured to contact the plurality of shafts from outside while being extended longer than a natural length, and the driven gear on each of the plurality of shafts is pressed against the scissors gear by an elastic force generated by the elastic member. In such a configuration, the plurality of driven gears respectively provided on the plurality of shafts and the scissors gear can be firmly engaged by the elastic force generated by the endless elastic member contacting the plurality of shafts from outside. As a result, each of the plurality of shafts can be turned while the backlash of the gears is reliably suppressed.

The rotary mounting head may be further include an endless toothed belt configured to surround the driven gear on each of the plurality of shafts and configured so that the toothed belt is engaged with the driven gear on each of the plurality of shafts from outside. In such a configuration, the turning of the plurality of driven gears can be precisely linked by the toothed belt engaged with the plurality of driven gears from outside, and each of the plurality of shafts can be turned while the backlash of the gears is suppressed.

The component mounting machine according to the disclosure includes the rotary mounting head as discussed above; and a component supplier configured to supply a component. The rotary mounting head is configured to mount the component supplied by the component supplier on a substrate. Thus, it is possible to configure at low cost while suppressing gear backlash.

According to the disclosure, the rotary mounting head for turning the plurality of shafts by driving the driven gear on each of the plurality of shafts can be configured at low cost while the backlash of the gears is suppressed.

DETAILED DESCRIPTION

Figure 1:
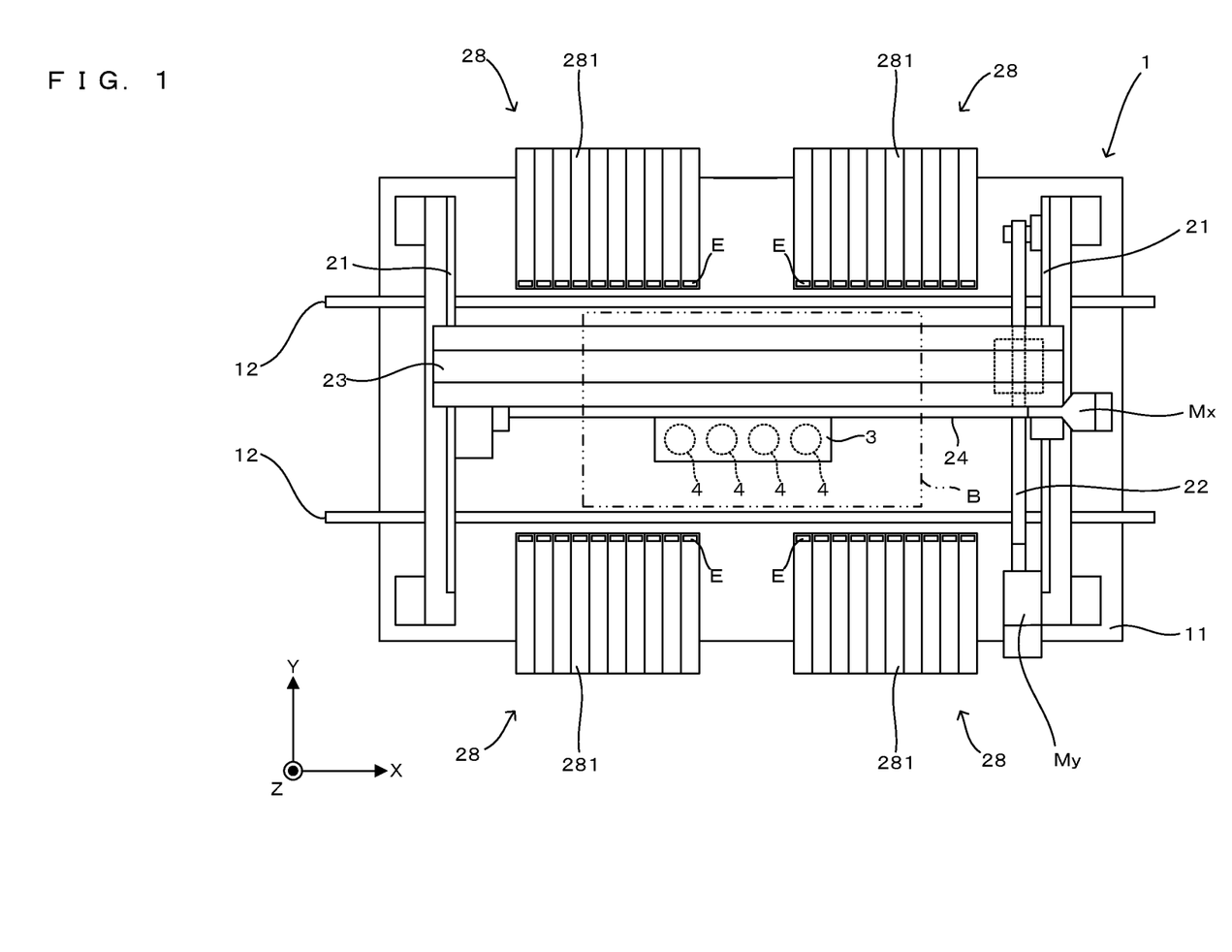
FIG. 1 is a partial plan view schematically showing a component mounting machine according to the disclosure.

FIG. 1 is a partial plan view schematically showing a component mounting machine according to the disclosure. In FIG. 1 and subsequent figures, X, Y and Z directions orthogonal to each other are shown as appropriate. Here, the X and Y directions are horizontal directions and the Z direction is a vertical direction. As shown in FIG. 1, the component mounting machine 1 includes a pair of conveyors 12, 12 provided on a base 11. The component mounting machine 1 mounts components on a substrate B loaded to a mounting/processing position (position of the substrate B in FIG. 1) from an upstream side in the X direction (substrate conveying direction) by the conveyors 12 and unloads the substrate B completed with component mounting from the mounting/processing position to a downstream side in the X direction by the conveyors 12.

In the component mounting machine 1, a pair of Y-axis rails 21, 21 extending in the Y direction, a Y-axis ball screw 22 extending in the Y direction and a Y-axis motor My for rotationally driving the Y-axis ball screw 22 are provided, and an X-axis rail 23 extending in the X direction is fixed to a nut of the Y-axis ball screw 22 while being supported on the pair of Y-axis rails 21, 21 movably in the Y direction. An X-axis ball screw 24 extending in the X direction and an X-axis motor Mx for rotationally driving the X-axis ball screw 24 are mounted on the X-axis rail 23, and a head unit 3 is fixed to a nut of the X-axis ball screw 24 while being supported on the X-axis rail 23 movably in the X direction. Therefore, the head unit 3 can be moved in the Y direction by turning the Y-axis ball screw 22 by the y-axis motor My, or the head unit 3 can be moved in the X direction by turning the X-axis ball screw 24 by the X-axis motor Mx.

Two component suppliers 28 are arranged in the X direction on each of both sides in the Y direction of the pair of conveyors 12, 12. A plurality of tape feeders 281 are detachably attached to each component supplier 28 side by side in the X direction, and a reel, on which a tape storing components E (chip electronic components) in the form of small pieces such as integrated circuits, transistors and capacitors at predetermined intervals is wound, is arranged in each tape feeder 281. The tape feeder 281 supplies the component E to a component supply position on a tip on the side of the head unit 3 by intermediately feeding the tape toward the head unit 3.

The head unit 3 includes a plurality of (four) mounting heads 4 linearly arranged in the X direction. Each mounting head 4 sucks and mounts a component E by nozzles N (FIG. 2) attached to a lower end. That is, the mounting head 4 moves to above the tape feeder 281 and sucks the component E supplied by the tape feeder 281. Specifically, the mounting head 4 sucks the component E by raising the nozzle N while generating a negative pressure in the nozzle N after lowering the nozzle N until the nozzle N comes into contact with the component E. Subsequently, the mounting head 4 moves to above the substrate B at the mounting/processing position and mounts the component E on the substrate B. Specifically, the mounting head 4 mounts the component by generating an atmospheric pressure or positive pressure in the nozzle N after lowering the nozzle N until the component E comes into contact with the substrate B.

Figure 2:
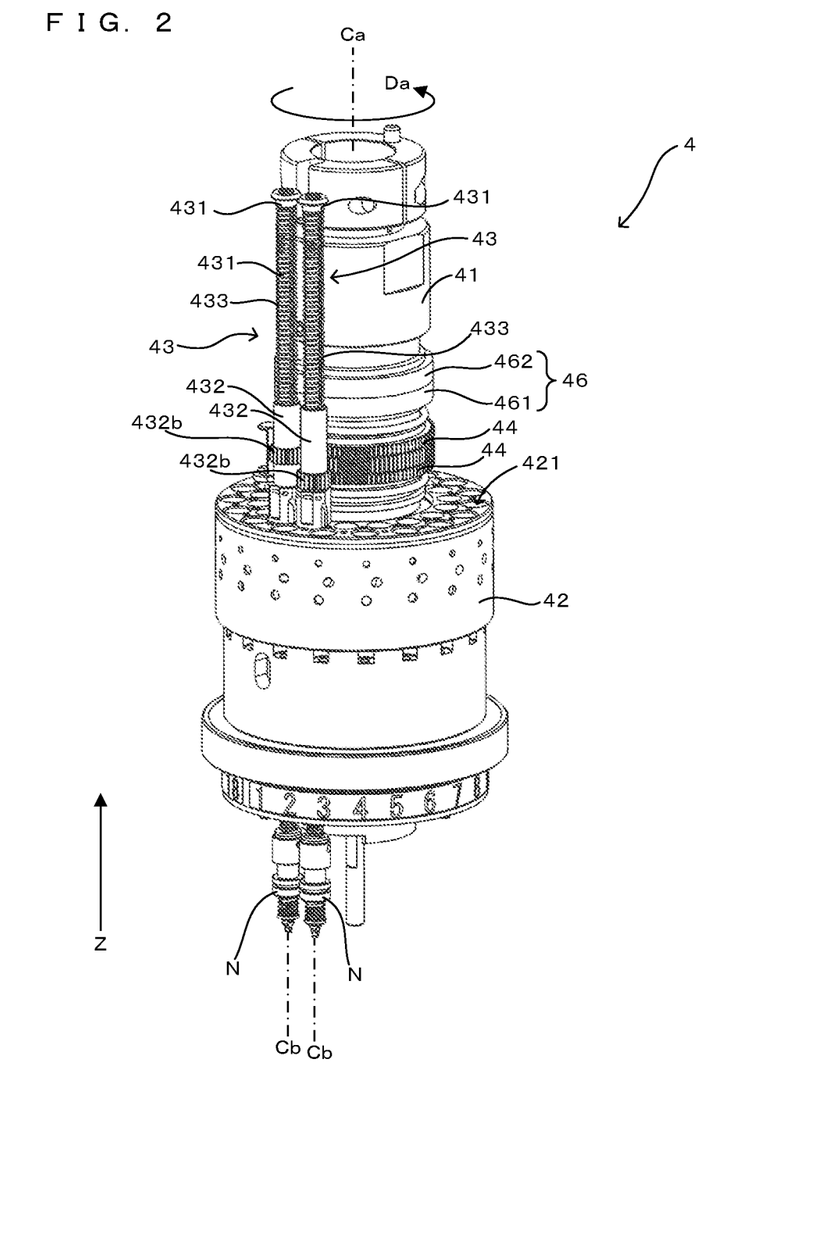
FIG. 2 is a perspective view showing the mounting head according to a first embodiment.
Figure 3:
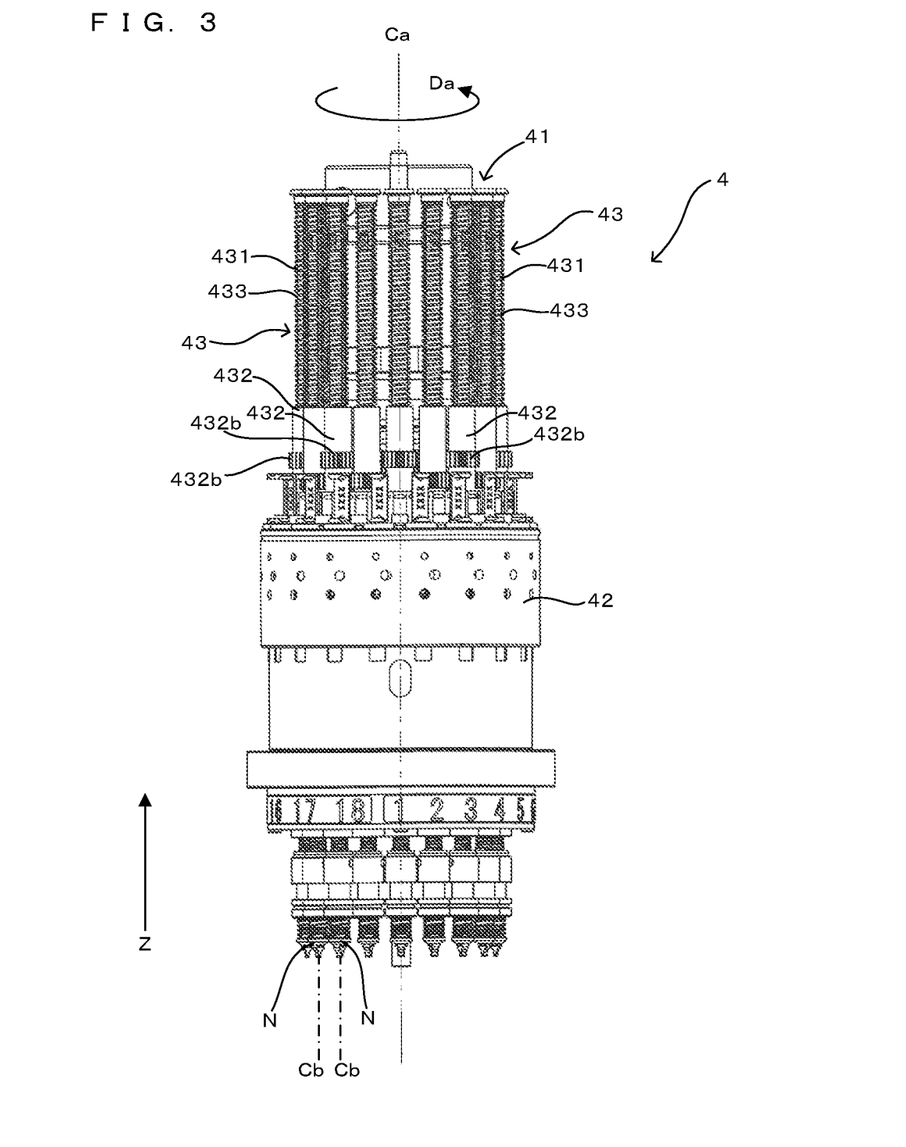
FIG. 3 is a front view showing the mounting head of FIG. 2.
Figure 4:
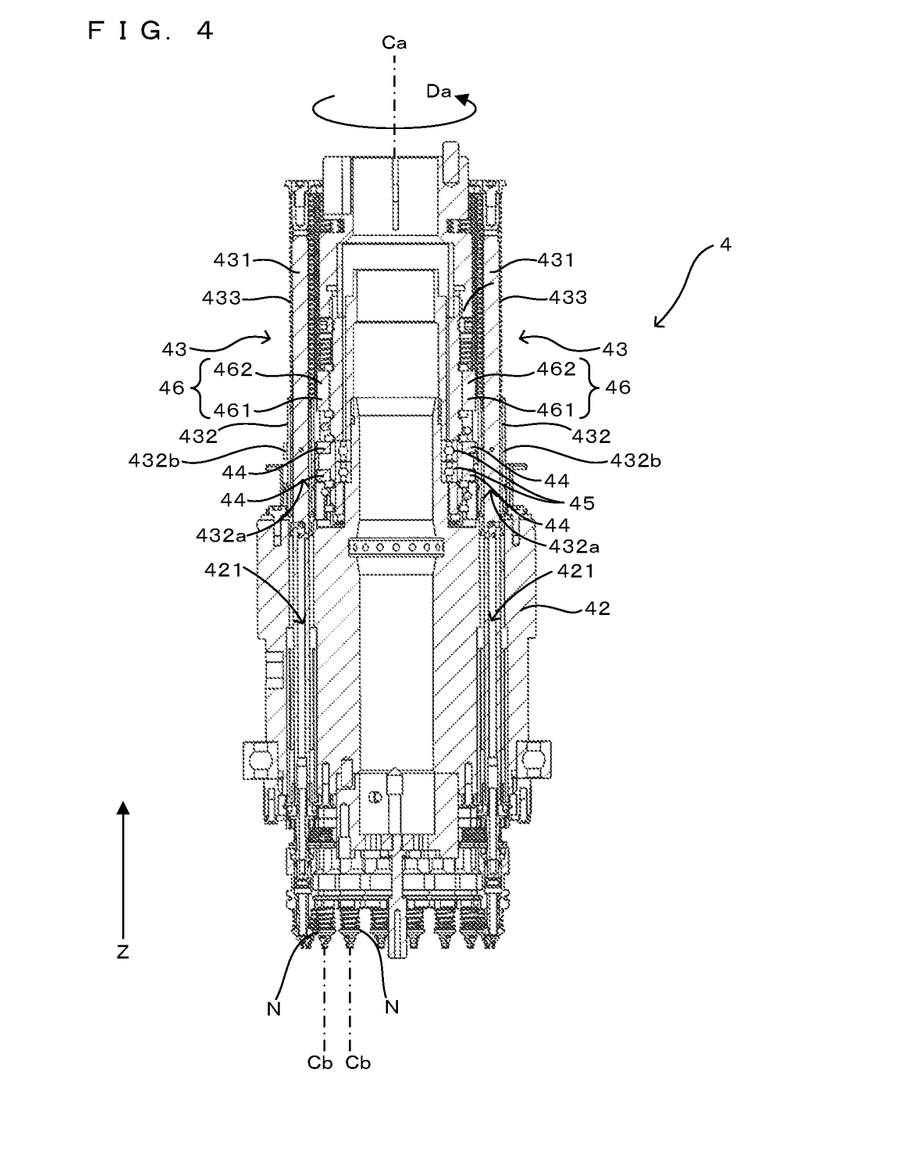
FIG. 4 is a sectional view showing the mounting head of FIG. 2.

FIG. 2 is a perspective view showing the mounting head according to a first embodiment, FIG. 3 is a front view showing the mounting head of FIG. 2, and FIG. 4 is a sectional view showing the mounting head of FIG. 2. As shown in FIGS. 2 to 4, the mounting head 4 is a rotary mounting head in which eighteen nozzles N are circumferentially arrayed. Next, the configuration of the mounting head 4 is described with reference to FIGS. 2 to 4. Note that since the four mounting heads 4 are common in configuration, one mounting head 4 is described here.

Terms "revolution" and "rotation" are used as appropriate to describe the turning of an object. Here, "revolution" indicates a turning movement of an object about a turning axis not passing through the object, and "rotation" indicates a turning movement of an object about a turning axis passing through the object.

The mounting head 4 includes a main rod 41 extending in parallel to the Z direction, and a shaft holder 42 supported on the lower end of the main rod 41. The shaft holder 42 is supported turnably in a revolution direction Da about an axis of revolution Ca (virtual axis) passing through a center of the main rod 41 and parallel to the Z direction, and turns about the axis of revolution Ca by receiving a drive force of a revolution motor (not shown). This shaft holder 42 includes eighteen shaft insertion holes 421 circumferentially arrayed at an equal angle θi (20°) about the axis of revolution Ca. The shaft insertion hole 421 penetrates in the Z direction, and a nozzle shaft 43 is supported by the shaft holder 42 while being inserted through the shaft insertion hole 421. In this way, eighteen nozzle shafts 43 supported by the shaft holder 42 are circumferentially arranged at the equal angle θi (20°) about the axis of revolution Ca. Therefore, if the shaft holder 42 turns about the axis of revolution Ca, the eighteen nozzle shafts 43 integrally revolve about the axis of revolution Ca. Note that, out of the eighteen nozzle shafts 43, only some (two) nozzle shafts 43 are shown in FIG. 2.

Each nozzle shaft 43 includes an elevating rod 431 extending in the Z direction and a spline shaft 432 attached to the shaft holder 42. The spline shaft 432 is attached to the shaft holder 42 while being inserted in the shaft insertion hole 421. The spline shaft 432 is provided with a rod insertion hole 432a penetrating in the Z direction, and the elevating rod 431 is inserted into the rod insertion hole 432a. Further, the nozzle shaft 43 includes a coil spring 433 externally fit on the elevating rod 431, and the coil spring 433 biases the elevating rod 431 upward with respect to the spline shaft 432. In this way, the elevating rod 431 is supported movably up and down by the spline shaft 432 and the coil spring 433. The lower end of such an elevating rod 431 is located below the shaft holder 42 and the nozzle N is attached to this lower end.

The nozzle shaft 43 is supported in the shaft holder 42 rotationally about an axis of rotation Cb (virtual axis) coinciding with a center axis of the nozzle shaft 43. Specifically, the spline shaft 432 of the nozzle shaft 43 is rotatable about the axis of rotation Cb with respect to the shaft holder 42. This spline shaft 432 restrains the elevating rod 431 in a turning direction about the axis of rotation Cb, and the spline shaft 432 and the elevating rod 431 integrally rotate about the axis of rotation Cb. This spline shaft 432 includes a driven gear 432b centered on the axis of rotation Cb above the shaft holder 42, and rotates together with the elevating rod 431 according to a torque applied to the driven gear 432b.

In such a configuration, the plurality of nozzle shafts 43 rotate about the respective axes of rotation Cb if torques are applied to the respective driven gears 432b. In contrast, the mounting head 4 includes drive gears 44 for driving and turning the plurality of nozzle shafts 43. The drive gears 44 are arranged above the shaft holder 42 with the axis of revolution Ca as a center. These drive gears 44 are externally fit on the main rod 41 via bearings 45, and turn about the axis of revolution Ca when receiving a drive force of an axis of rotation motor (not shown). In contrast, the plurality of driven gears 432b respectively provided on the plurality of nozzle shafts 43 are circumferentially arranged along the peripheral edges of the drive gears 44 and engaged with the drive gears 44 from outside. Therefore, the plurality of driven gears 432b are driven by the turning of the drive gears 44, and the plurality of nozzle shafts 43 rotate about the respective axes of rotation Cb thereof.

Particularly, the drive gear 44 is a scissors gear. This scissors gear includes two gears overlapping each other and a spring for biasing the two gears in a circumferential direction, and the two gears are displaced from each other in the circumferential direction against a biasing force of the spring when receiving an external force. Thus, the drive gear 44 and the driven gears 432b are engaged with backlash between the drive gear 44 and the driven gears 432b suppressed. Therefore, the nozzle shafts 43 can be rotated by precisely transmitting the turning of the drive gear 44 to the driven gears 432b.

Note that, in this example, two drive gears 44 are arranged at different heights. These drive gears 44 are fixed to each other and integrally turn. The driven gears 432b engaged with the upper drive gear 44, out of the two drive gears 44, and the driven gears 432b engaged with the lower drive gear 44 are alternately arranged. In this way, the heights of the driven gears 432b on the two adjacent nozzle shafts 43 are vertically shifted.

Further, the mounting head 4 includes a magnet 46 arranged above the drive gears 44. The magnet 46 has a disk shape centered on the axis of revolution Ca and is composed of a lower disk 461 having one of an N pole and an S pole and an upper disk 462 having the other of the N and S poles. That is, the magnet 46 includes the lower and upper disks 461, 462 having mutually different poles, and the lower and upper disks 461, 462 are stacked on each other. The lower end of the magnet 46 is located below the upper ends of the spline shafts 432, whereas the upper end of the magnet 46 is located above the lower ends of the spline shafts 432, and the magnet 46 and the spline shafts 432 are partially facing each other in a horizontal direction.

In contrast, the nozzle shafts 43 (at least the elevating rods 431 and the spline shafts 432) contain a soft magnetic material (e.g. iron) to be attracted to the magnet 46 by a magnetic force. Therefore, a magnetic force toward the magnet 46 acts on each of the plurality of nozzle shafts 43 arranged to surround the magnet 46. As a result, each of the plurality of driven gears 432b is pressed against the drive gear 44.

In the mounting head 4 according to the first embodiment described above, the plurality of driven gears 432b respectively provided on the plurality of nozzle shafts 43 are arranged along the peripheral edges of the drive gears 44 and engaged with the drive gears 44. Accordingly, the plurality of nozzle shafts 43 can be turned by turning the drive gears 44. Moreover, since the turning of the drive gears 44, which are scissors gears, is transmitted to the nozzle shafts 43 by the engagement of the drive gears 44 and the plurality of respective driven gears 432b, backlash between the drive gears 44 and the driven gears 432b is suppressed, it is not necessary to provide a backlashless gear (scissors gear) on each of the plurality of nozzle shafts 43 and the cost of the mounting head 4 is suppressed. By driving the driven gear 432b on each of the plurality of nozzle shafts 43 in this way, the mounting head 4 for turning the plurality of nozzle shafts 43 can be configured at low cost while the backlash between the driven gears 432b and the drive gears 44 is suppressed.

Further, the magnet 46 (pressing mechanism) is provided which presses the driven gears 432b on the plurality of respective nozzle shafts 43 against the drive gears 4 (scissors gears). By pressing the plurality of driven gears 432b against the drive gears 44 in this way, the plurality of respective driven gears 432b and the drive gears 44 can be firmly engaged. As a result, the plurality of nozzle shafts 43 can be turned while the backlash between the driven gears 432b and the drive gears 44 is reliably suppressed.

Further, by attracting the nozzle shafts 43 toward the drive gears 44 by the magnetic force of the magnet 46, the plurality of driven gears 432b are pressed against the drive gears 44. In such a configuration, the plurality of respective driven gears 432b and the drive gear 44 can be firmly engaged by the magnetic force. As a result, the plurality of nozzle shafts 43 can be turned while the backlash between the driven gears 432b and the drive gears 44 is reliably suppressed.

Figure 5:
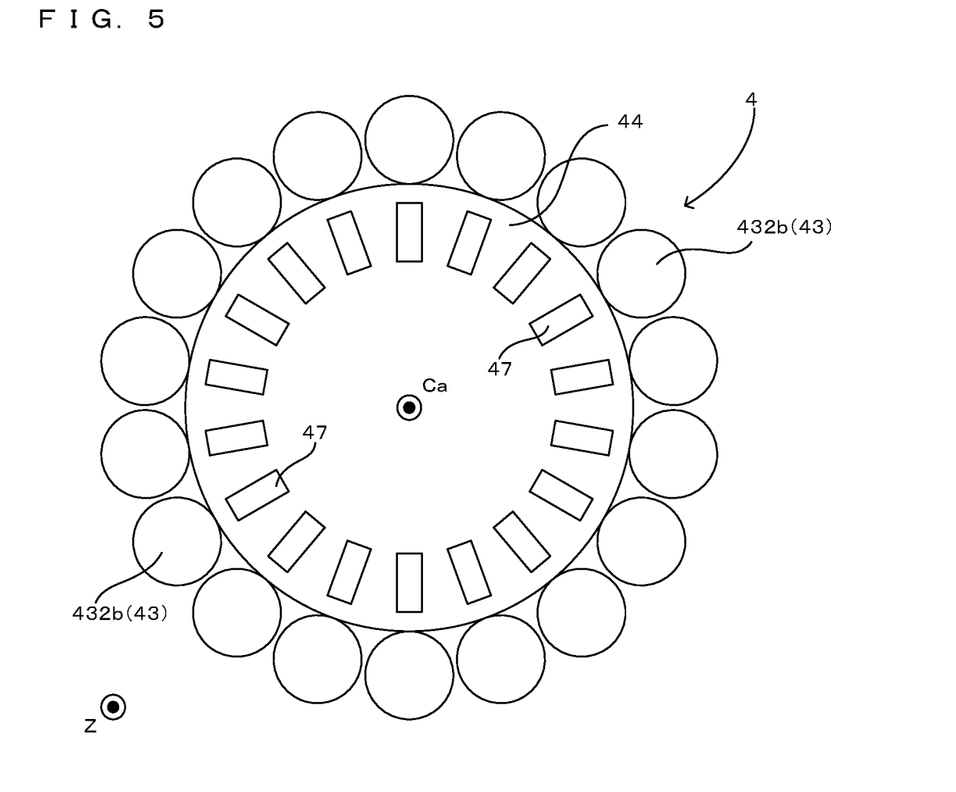
FIG. 5 is a plan view schematically showing a mounting head according to a second embodiment.

FIG. 5 is a plan view schematically showing a mounting head according to a second embodiment. The second embodiment differs from the first embodiment in a pressing mechanism for pressing nozzle shafts 43 against a drive gear 44, and the other configuration is common between the first and second embodiments. Accordingly, the following description is centered on these differences and common components are denoted by corresponding reference signs and not described. However, it goes without saying that similar effects are achieved by having the common configuration. This point applies also to each of embodiments described after the second embodiment.

A mounting head 4 of the second embodiment includes magnets 47 instead of the magnet 46. Specifically, eighteen magnets 47 are mounted on the upper surface of the drive gear 44. Note that the arrangement positions of the magnets 47 are not limited to those on the upper surface of the drive gear 44. Accordingly, the magnets 47 may be mounted on the lower surface of the drive gear 44 or may be embedded in the drive gear 44. Note that since the arrangement of the magnets 47 for two drive gears 44 described above is common, this is not particularly distinguished here.

The number of the magnets 47 is equal to that of all the nozzle shafts 43 provided in the mounting head 4, and the eighteen magnets 47 are circumferentially arranged at an equal angle θi (20°) about an axis of revolution Ca. In this way, the magnets 47 are circumferentially arranged inwardly of the circumferentially arranged nozzle shafts 43. An inner (side of the axis of revolution Ca) end of the magnet 47 has one of an N pole and an S pole, and an outer (side opposite to the axis of revolution Ca) of the magnet 47 has the other pole.

Further, the drive gear 44 contains a soft magnetic material (e.g. iron) and is magnetized by magnetic forces of the magnets 47. In view of this, the nozzle shafts 43 (at least driven gears 432*b*) also contain a soft magnetic material (e.g. iron). Accordingly, a magnetic force toward the drive gear 44 acts on each of a plurality of the nozzle shafts 43 arranged to surround the drive gear 44. As a result, each of a plurality of drive gears 432*b* is pressed against the drive gear 44.

Also in the second embodiment described above, the mounting head 4 includes scissors gears as the drive gears 44. Accordingly, the mounting head 4 for turning the plurality of nozzle shafts 43 by driving the driven gear 432*b* on each of the plurality of nozzle shafts 43 can be configured at low cost while the backlash between the driven gears 432*b* and the drive gears 44 is suppressed.

Further, in the second embodiment, the magnets 47 are mounted on the drive gear 44. Accordingly, each of the plurality of driven gears 432*b* and the drive gear 44 can be firmly engaged by attracting each of the plurality of nozzle shafts 43 (driven gears 432*b*) and the drive gear 44 to each other by magnetic forces generated by the magnets 47 mounted on the drive gear 44. As a result, the plurality of nozzle shafts 43 can be turned while the backlash between the driven gears 432*b* and the drive gear 44 is suppressed.

Figure 6:
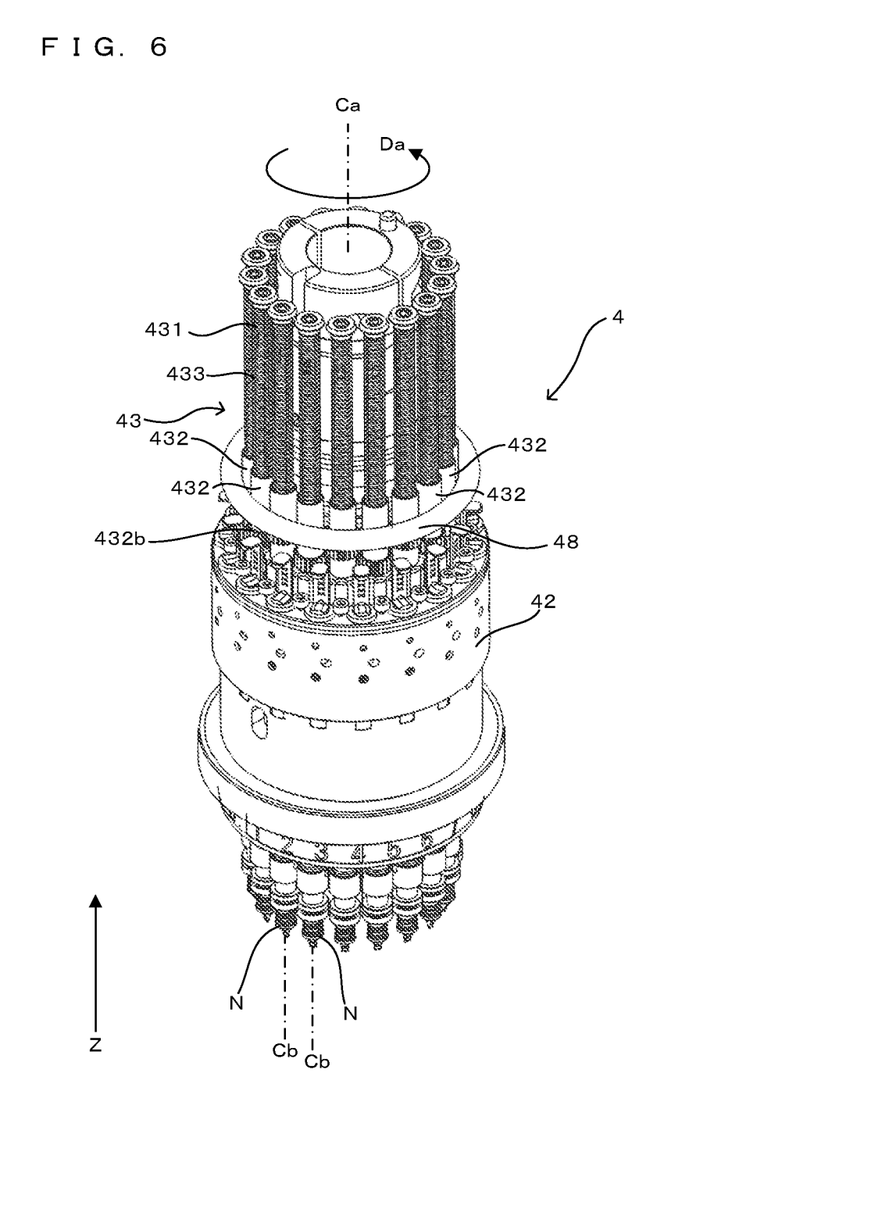
FIG. 6 is a perspective view showing a mounting head according to a third embodiment.
Figure 7:
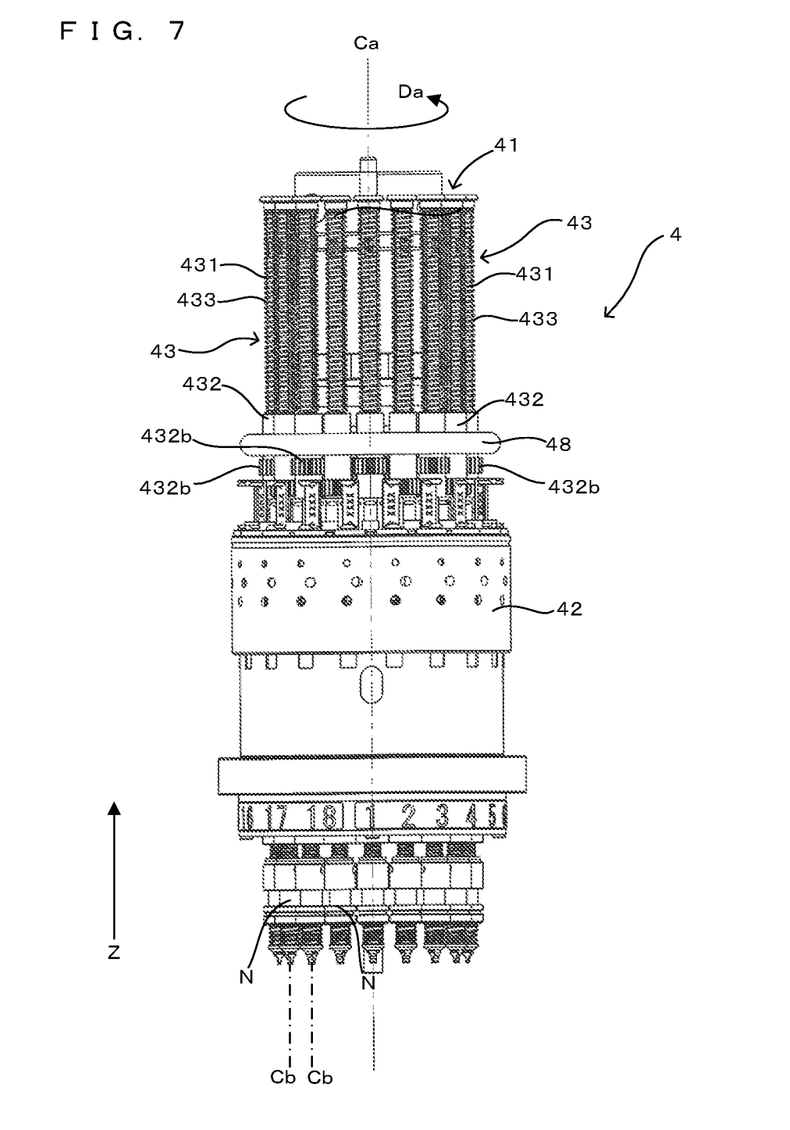
FIG. 7 is a front view of the mounting head of FIG. 6.

FIG. 6 is a perspective view showing a mounting head according to a third embodiment, and FIG. 7 is a front view of the mounting head of FIG. 6. In the third embodiment, the mounting head 4 does not include the magnet 46 and no magnetic force toward drive gears 44 acts on nozzle shafts 43 unlike the first embodiment. On the other hand, the mounting head 4 of the third embodiment includes an endless elastic ring 48.

The elastic ring 48 is, for example, a spring coil or the like made of silicon rubber or metal and has elasticity. That is, the elastic ring 48 generates an elastic force corresponding to an extended length from a natural length. In the mounting head 4, such an elastic ring 48 is externally fit to a plurality of nozzle shafts 43 while being extended from the natural length, and contacts each nozzle shaft 43 from outside (side opposite to an axis of revolution Ca). Specifically, the elastic ring 48 contacts eighteen spline shafts 432 and applies an elastic force toward the axis of revolution Ca to each spline shaft 432.

Note that the elastic ring 48 contacts the spline shafts 432 above driven gears 432*b* in this example. However, the contact position of the elastic ring 48 with the spline shafts 432 is not limited to this and may be below the driven gears 432*b*. Further, the elastic ring 48 may be arranged to contact the nozzle shafts 43 at positions other than the spline shafts 432.

Also in the third embodiment described above, the mounting head 4 includes the scissors gears as the drive gears 44. Accordingly, the mounting head 4 for turning the plurality of nozzle shafts 43 by driving the driven gear 432*b* on each of the plurality of nozzle shafts 43 can be configured at low cost while backlash between the driven gears 432*b* and the drive gears 44 is suppressed.

Further, the endless elastic ring 48 (elastic member) for surrounding the plurality of nozzle shafts 43 is provided in the third embodiment, and the elastic ring 48 contacts the plurality of nozzle shafts 43 from outside while being extended longer than the natural length. As a result, the driven gear 432*b* on each of the plurality of nozzle shafts 43 is pressed against the drive gear 44 by an elastic force generated by the elastic ring 48. In such a configuration, the plurality of driven gears 432*b* respectively provided on the plurality of nozzle shafts 43 and the drive gears 44 can be firmly engaged by the elastic force generated by the elastic ring 48. As a result, each of the plurality of nozzle shafts 43 can be turned while the backlash between the driven gears 432*b* and the drive gears 44 is reliably suppressed.

Figure 8:
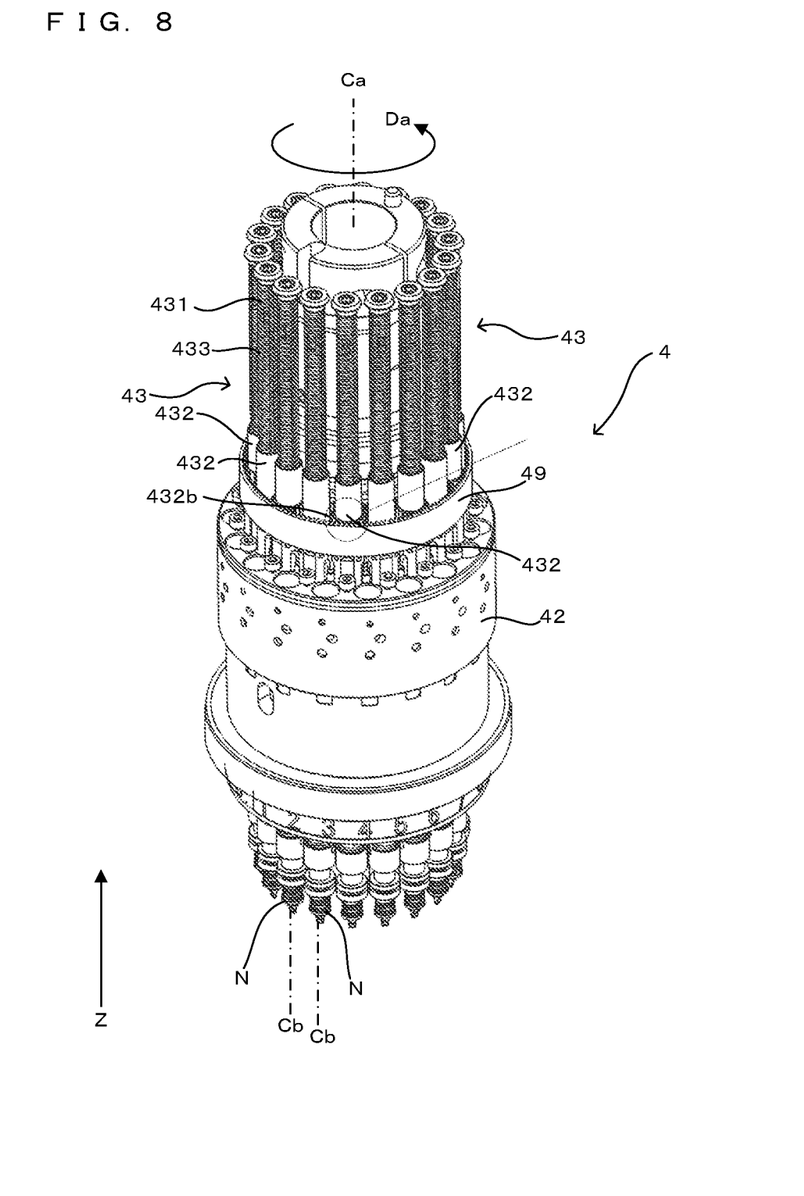
FIG. 8 is a perspective view showing a mounting head according to a fourth embodiment.
Figure 9:
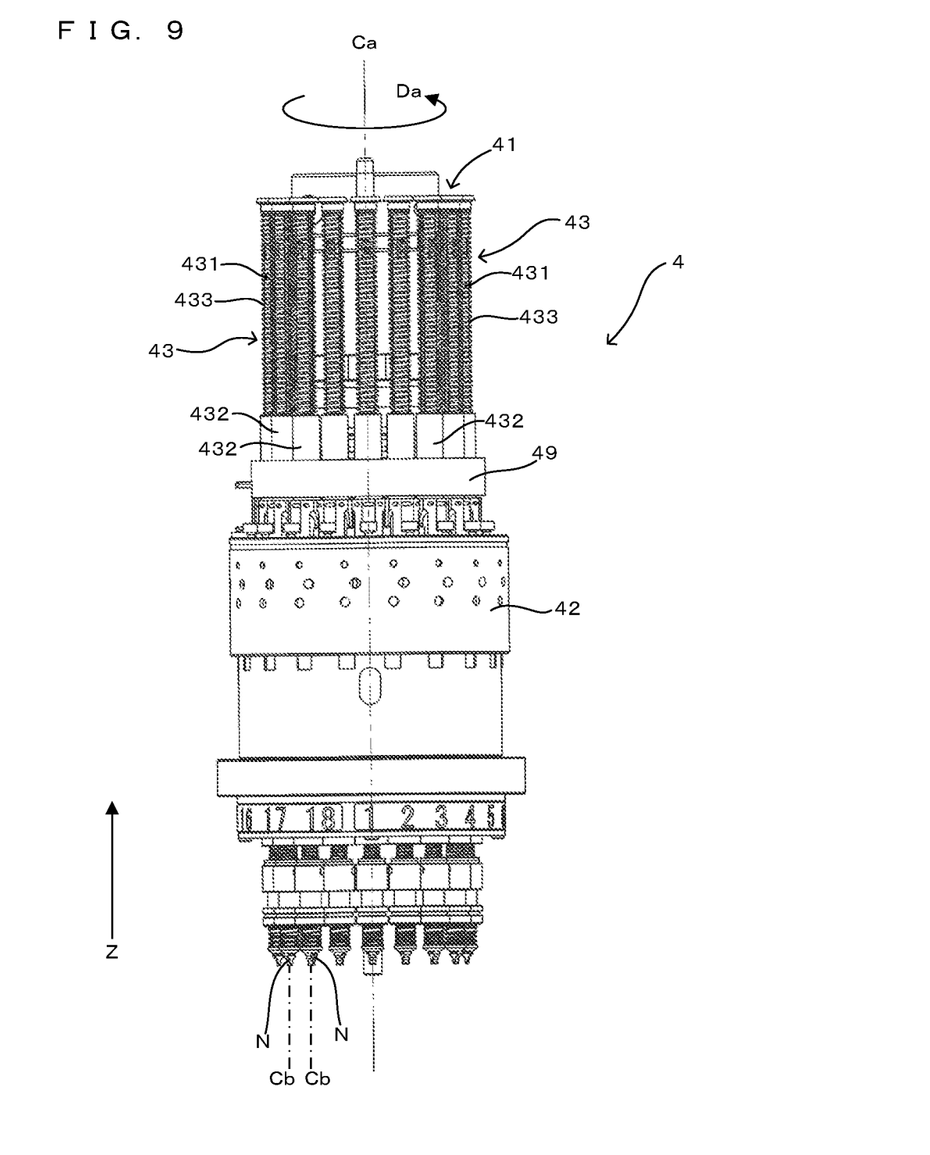
FIG. 9 is a front view showing the mounting head of FIG. 8.
Figure 10:
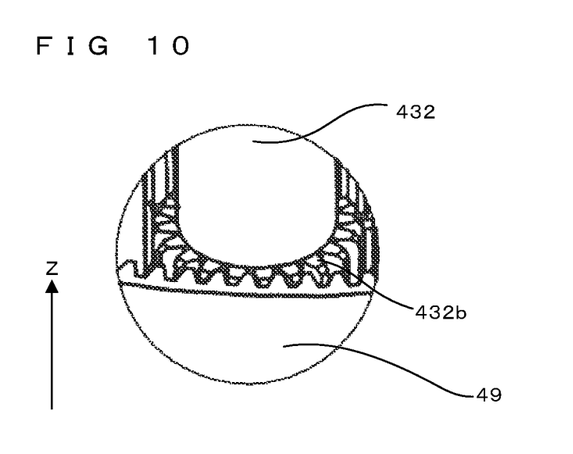
FIG. 10 is a partial enlarged view of the mounting head of FIG. 8.

FIG. 8 is a perspective view showing a mounting head according to a fourth embodiment, FIG. 9 is a front view showing the mounting head of FIG. 8 and FIG. 10 is a partial enlarged view of the mounting head of FIG. 8. In the fourth embodiment, the mounting head 4 does not include the magnet 46 and no magnetic force toward drive gears 44 acts on nozzle shafts 43 unlike the first embodiment. On the other hand, the mounting head 4 of the fourth embodiment includes an endless toothed belt 49. The toothed belt 49 is externally fit to eighteen driven gears 432*b* and engaged with each driven gear 432*b* from outside.

Also in the fourth embodiment described above, the mounting head 4 includes scissors gears as the drive gears 44. Accordingly, the mounting head 4 for turning the plurality of nozzle shafts 43 by driving the driven gear 432*b* on each of the plurality of nozzle shafts 43 can be configured at low cost while backlash between the driven gears 432*b* and the drive gears 44 is suppressed.

Further, the endless toothed belt 49 for surrounding the plurality of driven gears 432*b* is provided in the fourth embodiment, and the toothed belt 49 is engaged with the plurality of driven gears 432*b* from outside. In such a configuration, the turning of the plurality of driven gears 432*b* can be precisely linked by this toothed belt 49, and each of the plurality of nozzle shafts 43 can be turned while the backlash between the driven gears 432*b* and the drive gears 44 is reliably suppressed.

As described above, in the embodiments described above, the component mounting machine 1 corresponds to an example of a "component mounting machine" of the disclosure, the component supplier 28 corresponds to an example of a "component supplier" of the disclosure, the mounting head 4 corresponds to an example of a "rotary mounting head" of the disclosure, the nozzle shaft 43 corresponds to an example of a "shaft" of the disclosure, nine nozzle shafts 43, which are half of the eighteen nozzle shafts 43 provided in the mounting head 4, correspond to "a plurality of shafts" of the disclosure, the driven gear 432*b* corresponds to an example of a "driven gear" of the disclosure, the drive gear 44 corresponds to an example of a "scissors gear" of the disclosure, the magnet 46 corresponds to examples of a "pressing mechanism" and a "magnet" of the disclosure, the magnet 47 corresponds to examples of the "pressing mechanism" and the "magnet" of the disclosure, the elastic ring 48 corresponds to an example of an "elastic member" of the disclosure, and the toothed belt 49 corresponds to an example of a "toothed belt" of the disclosure.

Note that the disclosure is not limited to the above embodiments and various changes can be made in addition to the aforementioned ones without departing from the gist of the disclosure. For example, the first to fourth embodiments may be combined as appropriate. For example, in the mounting head 4 of the first embodiment, both the magnet 46 and the magnets 47 may be provided or the elastic ring 48 may be added. Further, the toothed belt 49 may be provided in the mounting head 4 of the first, second or third embodiment.

Further, the orientation and arrangement of the magnet 46 may be changed as appropriate in the first embodiment, or the number and array of the magnets 47 may be changed as appropriate in the second embodiment.

Further, it is also possible to change the arrangement positions of the drive gears 44, change the number of the nozzle shafts 43 or change various configurations of the mounting head 4.

Further, the mounting head 4 needs not necessarily include the pressing mechanism (magnet 46, magnets 47 and elastic ring 48) for pressing the driven gears 432*b* against the drive gears 44 in the first to third embodiments and needs not necessarily include the toothed belt 49 in the fourth embodiment.

Further, the number of the drive gears 44 is not limited to two and may be one. In the case of providing a single drive gear 44, each of the above embodiments may be so changed that the driven gears 432*b* on all (eighteen) the nozzle shafts 43 of the mounting head 4 contact the single drive gear 44 from outside to be engaged with this single drive gear 44.

What is claimed is:

1. A rotary mounting head, comprising:
a scissors gear;
a plurality of shafts each including a driven gear configured to engage with the scissors gear and arrayed along a peripheral edge of the scissors gear; and
a pressing mechanism configured to press the driven gear on each of the plurality of shafts against the scissors gear, wherein
the pressing mechanism is configured to press the driven gear on each of the plurality of shafts against the scissors gear by attracting the shafts toward the scissors gear by a magnetic force.

2. A rotary mounting head, comprising:
a scissors gear;
a plurality of shafts each including a driven gear configured to engage with the scissors gear and arrayed along a peripheral edge of the scissors gear; and
a pressing mechanism configured to press the driven gear on each of the plurality of shafts against the scissors gear, wherein
the pressing mechanism includes a magnet mounted on the scissors gear and is configured to attract the shafts and the scissors gear to each other by a magnetic force generated by the magnet.

3. A component mounting machine, comprising:
the rotary mounting head according to claim 1; and
a component supplier configured to supply a component, wherein
the rotary mounting head is configured to mount the component supplied by the component supplier on a substrate.

4. A component mounting machine, comprising:
the rotary mounting head according to claim 2; and
a component supplier configured to supply a component, wherein
the rotary mounting head is configured to mount the component supplied by the component supplier on a substrate.

* * * * *